United States Patent [19]

Fujii et al.

[11] Patent Number: 5,049,950

[45] Date of Patent: Sep. 17, 1991

[54] MIS STRUCTURE PHOTOSENSOR

[75] Inventors: Yoshihisa Fujii, Nagoya; Mitsuhiro Shigeta, Joyo; Katsuki Furukawa, Sakai; Kenji Nakanishi, Shijonawate; Atsuko Ogura, Nara, all of Japan

[73] Assignee: Sharp Kabushiki Kaisha, Osaka, Japan

[21] Appl. No.: 565,206

[22] Filed: Aug. 9, 1990

Related U.S. Application Data

[63] Continuation of Ser. No. 218,905, Jul. 14, 1988, abandoned.

[30] Foreign Application Priority Data

Jul. 14, 1987 [JP] Japan .................. 62-175216

[51] Int. Cl.[5] ............. H01L 45/00; H01L 27/14; H01L 31/00
[52] U.S. Cl. .................................... 357/2; 357/30
[58] Field of Search ............ 357/30, 16, 2, 6, 61, 357/2

[56] References Cited

U.S. PATENT DOCUMENTS

| | | | |
|---|---|---|---|
| 4,329,699 | 5/1982 | Ishihara et al. | 357/2 |
| 4,403,239 | 9/1983 | Yamazaki | 357/30 |
| 4,451,838 | 5/1984 | Yamazaki | 357/2 |
| 4,521,800 | 6/1985 | Howe | 357/67 |
| 4,582,561 | 4/1986 | Ioku | 156/624 |
| 4,600,670 | 7/1986 | Yamazaki | 430/57 |
| 4,681,984 | 7/1987 | Moeller | 136/258 |
| 4,849,797 | 7/1989 | Ukai | 357/23.7 |

FOREIGN PATENT DOCUMENTS 63-271970 3/1989 Japan .................. 357/2

OTHER PUBLICATIONS

"Metal-Oxide-Semiconductor Characteristics of Chemical Vapor Deposited SiC", Japanese J. of Appl. Physics, Nov. 1984, pp. 862-864 (Shibahara et al).

Hayashi, "Switching Phenomena in Thin-Insulator Metal-Insulator-Semiconductor Diodes", *Appl. Phys. Lttr.*, 37(4), 1980.

Green et al., "High Efficiency . . . Min MIS Solar Cells", 14th IEEE Photovoltaic Specialists Conf., 1980, in San Diego, Calif.

Sze, *Semiconductorl Devices*, 1985.

"Metal-Oxide-Semiconductor Characterisitcs of Chemical Vapor Deposited Cubic-SIC", Japanese Jounral of Applied Physics, Nov. 1984, pp. 862-864.

Primary Examiner—Jerome Jackson, Jr.
Assistant Examiner—Stephen D. Meier

[57] ABSTRACT

A MIS structure is provided which uses a photoconductive amorphous silicon carbide layer as an insulator layer in the MIS structure. The insulator layer is disposed on an n-type layer of single crystal silicon carbide and a translucent metal layer is disposed thereon. The metal layer is biased with a negative voltage so that the capacitance between the metal layer and the semiconductor layer changes in response to whether on the metal layer is illuminated with light.

6 Claims, 1 Drawing Sheet

MIS STRUCTURE PHOTOSENSOR

This application is a continuation of application Ser. No. 07/218,905 filed on July 14, 1988, now abandoned.

BACKGROUND OF THE INVENTION

This invention relates to a MIS (Metal Insulator Semiconductor) structure having a photosensor function which uses silicon carbide (SiC) single crystal.

Silicon carbide has a wide forbidden band (2.2-3.3 eV) and is thermally, chemically and mechanically very stable and further resistant to radiation damages. Therefore, semiconductor elements which use silicon carbide maybe applied in a wide range of applications under severe conditions such as under high temperature, and high output, high levels of radiation conditions in which conventional semiconductor elements using silicon (Si) or the like are difficult to be used.

In recent years, a method of growing silicon carbide single crystal of the 3C type ($\beta$ type) having an excellent quality and a larger area provided on a Si single crystal substrate has been developed by using the vapor growth method (CVD method) (Japanese Patent Application No. Sho 58-76842 published on Nov. 17, 1988). Further, a method of growing SiC single crystal has been developed in which a surface of the Si substrate is carbonized by heating the substrate in an atmosphere of hydrocarbon gas to produce a silicon carbide thin film thereon. Thereby the SiC single crystal is grown by the CVD method. This method has become the well-known art. In addition, reports on MOS (Metal Oxide Semiconductor) FET prototypes using a SiC single crystal thermal oxidation film have been announced. However, a silicon dioxide (SiO2) film obtained from the thermal-oxidation of silicon carbide does not generally have good insulation characteristics and the interfacial state density between the silicon carbide and the silicon dioxide is large. Therefore, good characteristics of the elements have not yet been obtained. In order to solve these problems, a method of depositing an amorphous silicon carbide (SiC) film as an insulator has been developed (Japanese Patent Application No. Sho 62-105613published on Nov. 9, 1984). This amorphous SiC film has developed good insulation resistance in the dark and has provided photoconductivity from light illumination.

SUMMARY OF THE INVENTION

It is an object of the present invention to provide a MIS structure photosensor which can be used in severe conditions.

Another object of the present invention is to increase the demand for SiC semiconductors.

According to the present invention, a MIS structure photosensor includes an n-type semiconductor layer formed of single crystal silicon carbide, a photoconductive insulator layer formed on amorphous silicon carbide being disposed directly on the semiconductor layer and a translucent metal layer being disposed directly on the insulator layer. The metal layer is biased with a negative voltage so that the capacitance between the metal layer and the semiconductor layer changes in response to whether or not the metal layer is illuminated with light.

As mentioned above, by depositing a photoconductive layer of amorphous SiC on the SiC single crystal, the MIS structure can be manufactured to provide the photosensor function.

The principle of the operation is described as follows. The voltage-electro-static capacitance characteristics for the MIS elements of the n-type SiC single crystal—amorphous SiC—translucent metal electrode structure are shown in FIG. 2. When a negative bias voltage is applied to the metal electrode (metal electrode 4 as shown in FIG. 1) in the dark, an inversion layer develops on the n-type SiC single crystal surface. Therefore, the capacitance value becomes a constant A as shown in FIG. 2. When the metal electrode is illuminated by light, the amorphous SiC becomes conductive and positive holes on the n-type SiC single crystal surface flow into the metal electrode. Thereby the inversion layer is not produced and the voltage-electrostatic capacitance characteristics change to B as shown in FIG. 2. Accordingly, when the element is biased with a voltage of $-V$ and is exposed to light illumination, the capacitance of the element is indicated by $C_{dark}$. When the element is exposed to light, the capacitance is indicated by $C_{illu}$. Thereby, an element that changes its capacitance can be obtained.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

An embodiment of the present invention is now described in detail but the invention is not limited thereto.

Figure 1:
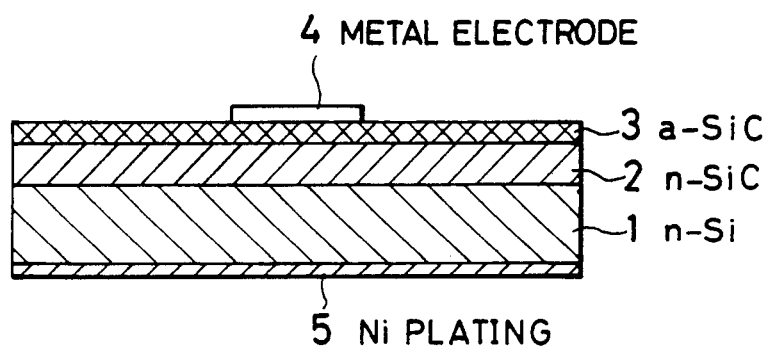
FIG. 1 is a sectional view showing an embodiment of the present invention.
Figure 2:
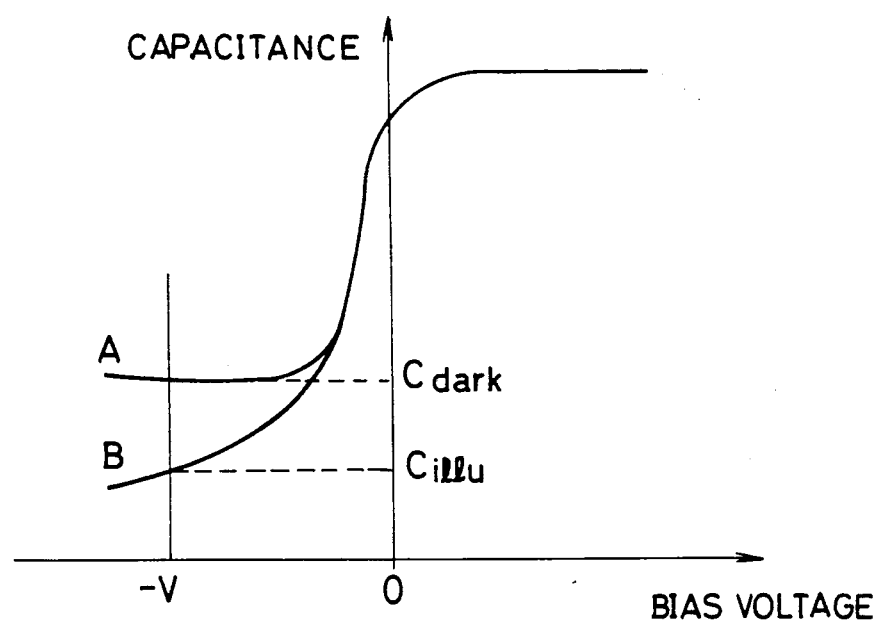
FIG. 2 is a voltage-capacitance characteristic curve resulting from an embodiment of the present invention.

FIG. 1 is a sectional view showing an embodiment of MIS structure photosensor according to the present invention. A process for producing the MIS structure is described as follows. First, an n-type Si single crystal substrate 1 is placed on a sample stand and into a reaction tube having CVD growth equipment where hydrogen gas is supplied as a carrier gas at a rate of 3 liters/minute, and propane gas is supplied as a material gas at a rate of about 1 cc minute. The Si single crystal substrate 1 which is placed on a graphite sample stand in the reaction tube is heated by a high frequency current flowing in a work coil wound outside of the reaction tube to a temperature of about 1350° C. and this heating condition is provided for about 1-5 minutes. Thus, the surface of the Si single crystal substrate 1 is carbonized and a silicon carbide single crystal thin film is produced. Then, the monosilane and propane gases are supplied into the reaction tube at a rate of between 0.1-0.9 cc/minutes with a carrier gas of hydrogen for growing the n-type SiC single crystal film 2 at a temperature between 1300°-1350° C. Thereby, a grown film of about 3 µm is grown in an hour.

Then, the high frequency current flowing in the work coil is reduced to keep the temperature of the graphite sample stand between 400°-700° C. and the monosilane and propane gases are supplied into the reaction tube for depositing amorphous SiC 3 on the n-type SiC single crystal film 2 so that film of about 1000 Åis deposited thereon in 10 minutes.

An electrode 4 is formed on the amorphous SiC film 3 by a vacuum evaporation of gold. An ohmic electrode for the n-type SiC single crystal 2 is formed by an Ni plating 5 on a back surface of the Si substrate 1 that makes an ohmic contact with the SiC single crystal 2.

When a bias voltage of −5V (where the gold electrode 4 is in a negative potential) is applied to the MIS structure photosensor thus formed, an electrostatic capacitance variation depending on whether light is illumenated or not will exist. Furthermore, the photosensor has been shown to operate at temperatures up to 500° C.

There is a most suitable thickness for the amorphous SiC. If the thickness is less than 100 Å, it is difficult to form the amorphous SiC layer uniformly on the SiC single crystal and the operation of the MIS structure becomes unstable because of an increase in leakage current. But if the thickness is more than 1 μm, the capacitance of the amorphous SiC itself becomes small and the MIS structure almost does not show a capacitance variation due to the bias voltage variation.

In this embodiment, amorphous SiC is deposited by the CVD method, but the plasma CVD method or the reactive sputtering method may also be used for this purpose.

While only certain embodiments of the present invention have been described, it will be apparent to those skilled in the art that various changes and modifications may be made therein without departing from the spirit and scope of the present invention as claimed.

What is claimed is:

1. A structure for a MIS photosensor comprising:
   a semiconductor layer having a top surface and formed on n-type single crystal silicon carbide;
   a photoconductive insulator layer is formed of amorphous silicon carbide and disposed on said top surface of said semiconductor layer;
   a translucent metal layer disposed on said photoconductive insulator layer and biased with a negative voltage with respect to a semiconductor substrate; and
   an inversion layer developed at said top surface of said semiconductor layer is response to said translucent metal layer being biased with said negative voltage so that the capacitance between said semiconductor layer and said translucent metal layer changes corresponding to the selective illumination of said translucent metal layer.

2. A structure as claimed in claim 1, wherein said photoconductive insulator layer is formed to a thickness between a range of 100 Å to 1 μm.

3. A structure for a MIS photosensor comprising:
   a substrate formed of n-type crystal silicon having a top surface;
   a semiconductor layer formed of n-type single crystal silicon carbide having a top surface and a bottom surface, said bottom surface being disposed of said top surface of said substrate;
   a photoconductive insulator layer formed of amorphous silicon carbide and disposed on said top surface of said semiconductor layer;
   a translucent metal electrode disposed on said photoconductive insulator layer and biased with a negative voltage with respect to said substrate;
   an ohmic metal electrode disposed on a bottom surface of said substrate opposite to said top surface; and
   an inversion layer developed at said top surface of said semiconductor layer in response to said translucent metal layer being biased with said negative voltage so that the capacitance between said semiconductor layer and said translucent metal layer changes corresponding to the selective illumination of said translucent metal layer.

4. A structure as claimed in claim 3, wherein said photoconductive insulator layer is formed to a thickness between the range of 100 Å to 1 μm.

5. A structure as claimed in claim 3, wherein said translucent metal electrode comprises Au.

6. A structure as claimed in claim 3, wherein said ohmic metal electrode comprises Ni.

* * * * *